United States Patent
Murakami et al.

(10) Patent No.: US 7,154,218 B2
(45) Date of Patent: Dec. 26, 2006

(54) LIGHTING EMITTING DEVICE AND METHOD OF FABRICATING THE SAME

(75) Inventors: Satoshi Murakami, Tochigi (JP); Noriko Miyagi, Shiga (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 51 days.

(21) Appl. No.: 10/729,307

(22) Filed: Dec. 5, 2003

(65) Prior Publication Data
US 2004/0256979 A1 Dec. 23, 2004

(30) Foreign Application Priority Data
Dec. 10, 2002 (JP) .............................. 2002-357532

(51) Int. Cl.
*H01J 1/62* (2006.01)
(52) U.S. Cl. ..................... 313/506; 313/509; 313/512
(58) Field of Classification Search ................ 313/498, 313/506, 509, 512
See application file for complete search history.

(56) References Cited

U.S. PATENT DOCUMENTS

| | | | |
|---|---|---|---|
| 4,769,686 A | 9/1988 | Horiuchi et al. | |
| 6,559,594 B1 | 5/2003 | Fukunaga et al. | |
| 6,608,449 B1 | 8/2003 | Fukunaga | |
| 6,828,725 B1 * | 12/2004 | Kimura | 313/505 |
| 2002/0047555 A1 | 4/2002 | Inukai | |
| 2003/0058210 A1 | 3/2003 | Yamazaki et al. | |
| 2003/0062826 A1 | 4/2003 | Seo et al. | 313/504 |

FOREIGN PATENT DOCUMENTS

| | | |
|---|---|---|
| JP | 2000-077191 | 3/2000 |
| JP | 2001-043980 | 2/2001 |

* cited by examiner

*Primary Examiner*—Vip Patel
(74) *Attorney, Agent, or Firm*—Cook, Alex, McFarron, Manzo, Cummings & Mehler, Ltd.

(57) ABSTRACT

Processes concerning the formation of an interlayer insulating film or a contact hole increase if an electrode of a light emitting element and a wiring are manufactured with different layers. Therefore, it suggests a light emitting element with a new structure which enables to shorten the processes. A light emitting device of the present invention has a structure integrated an electrode of a light emitting element and a source electrode. Thereby, processes concerning the formation of an interlayer insulating film and a contact hole can be reduced and be shortened. In addition, an electrode structure that can be waited a portion which functions as an electrode of a light emitting element, and a portion which functions as a source electrode with its sufficient function is adopted.

15 Claims, 12 Drawing Sheets

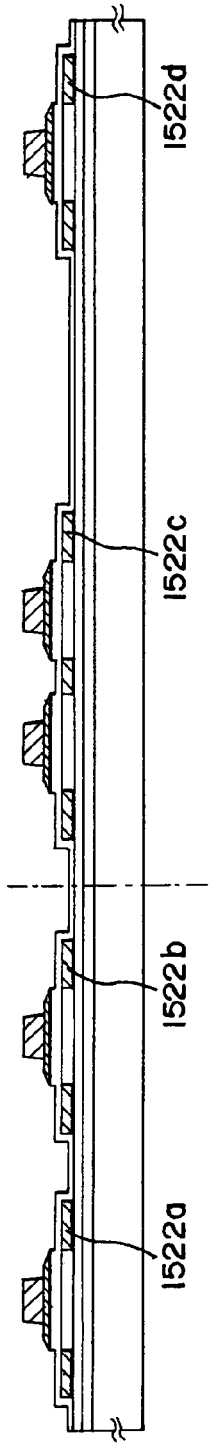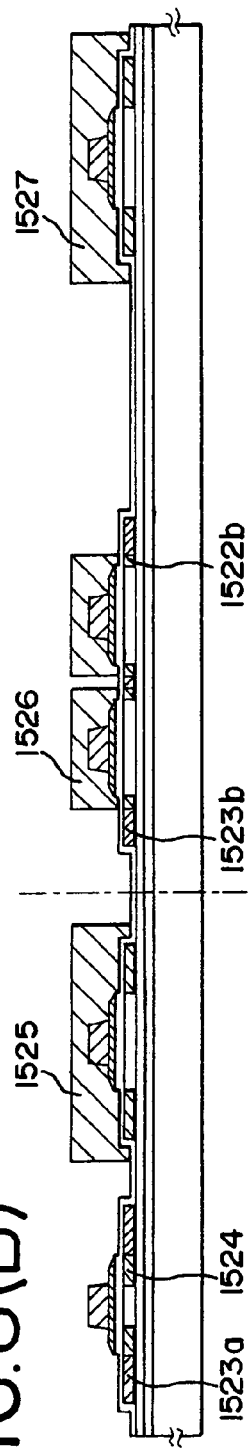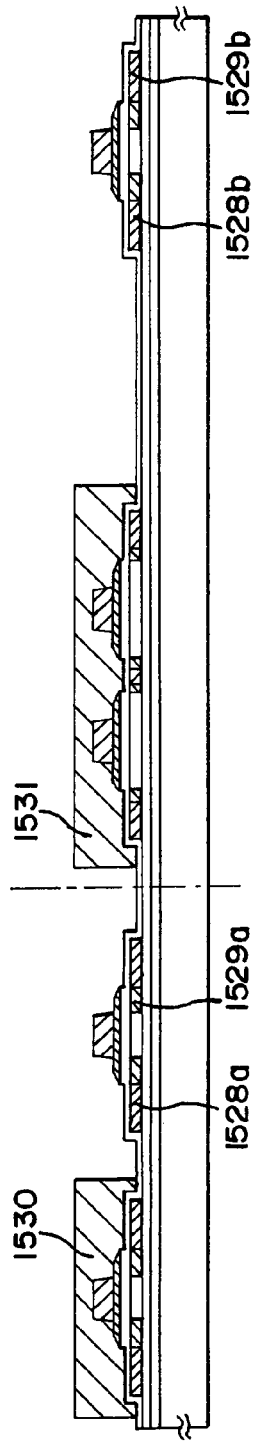

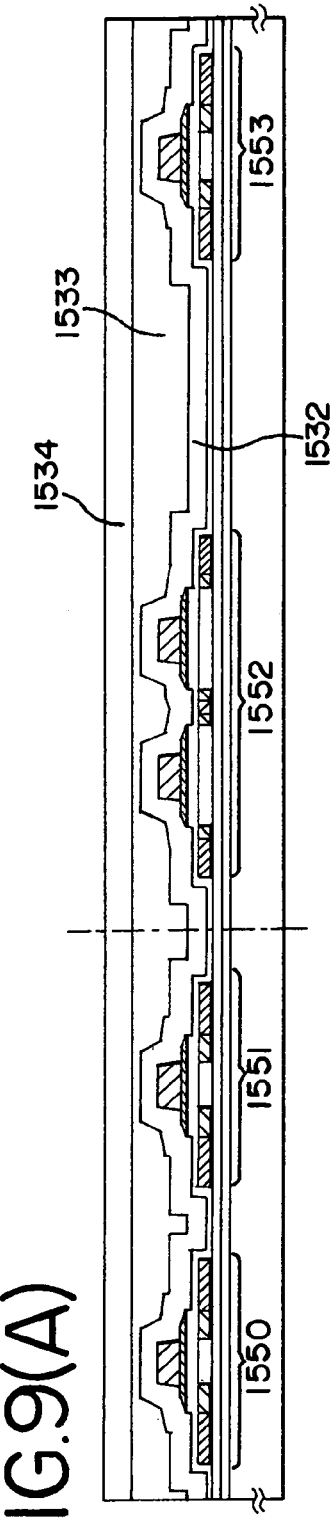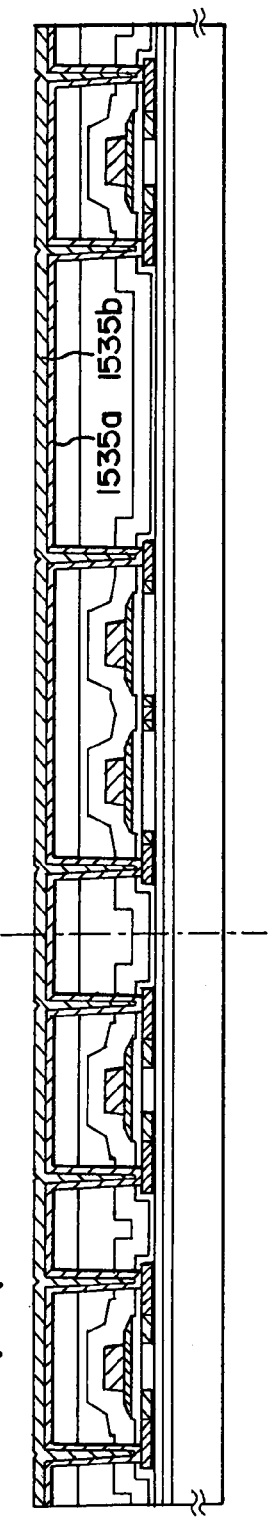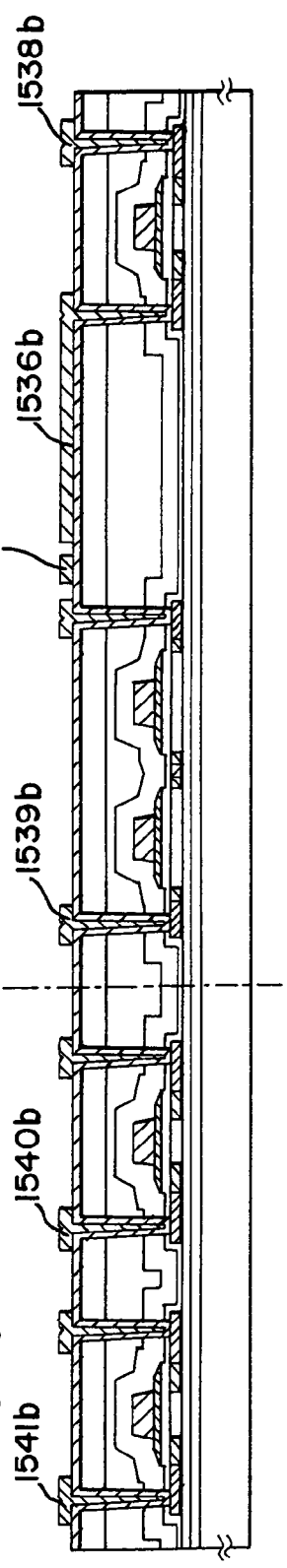

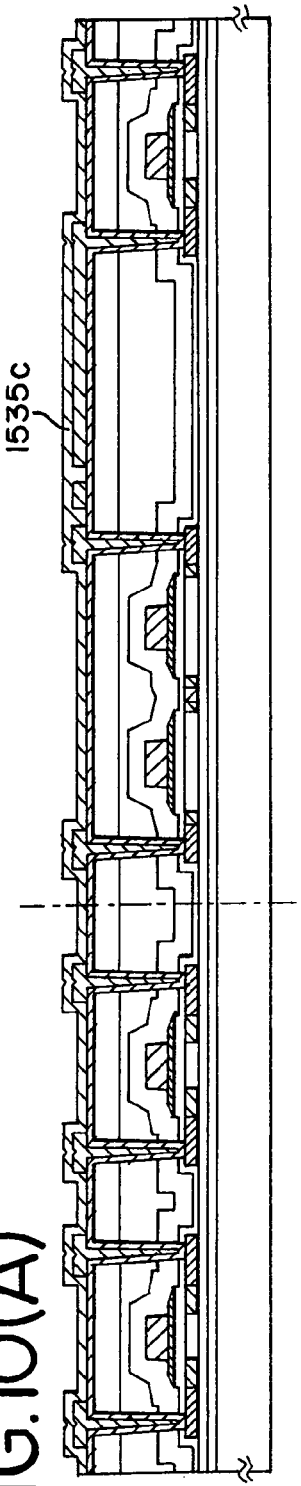
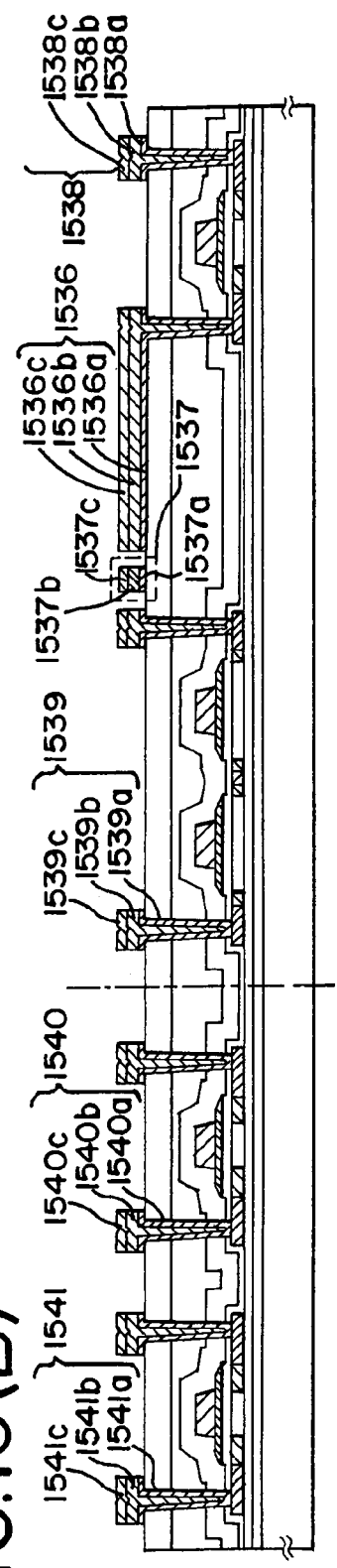
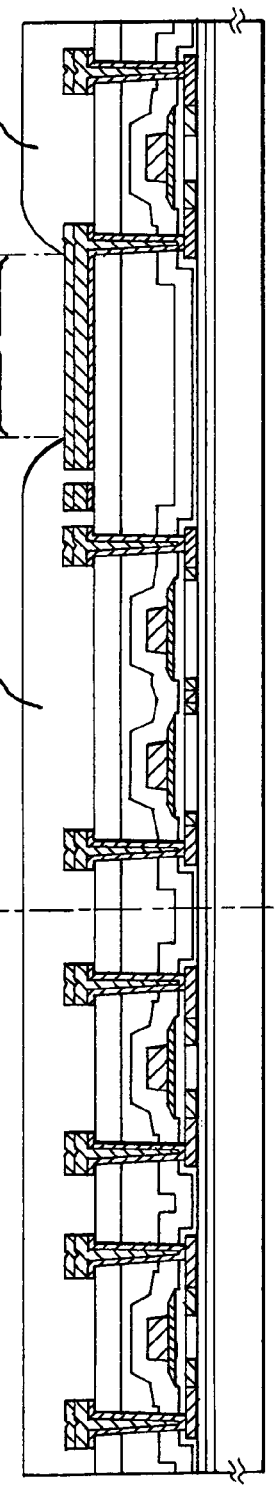
FIG.10(A)
FIG.10(B)
FIG.10(C)

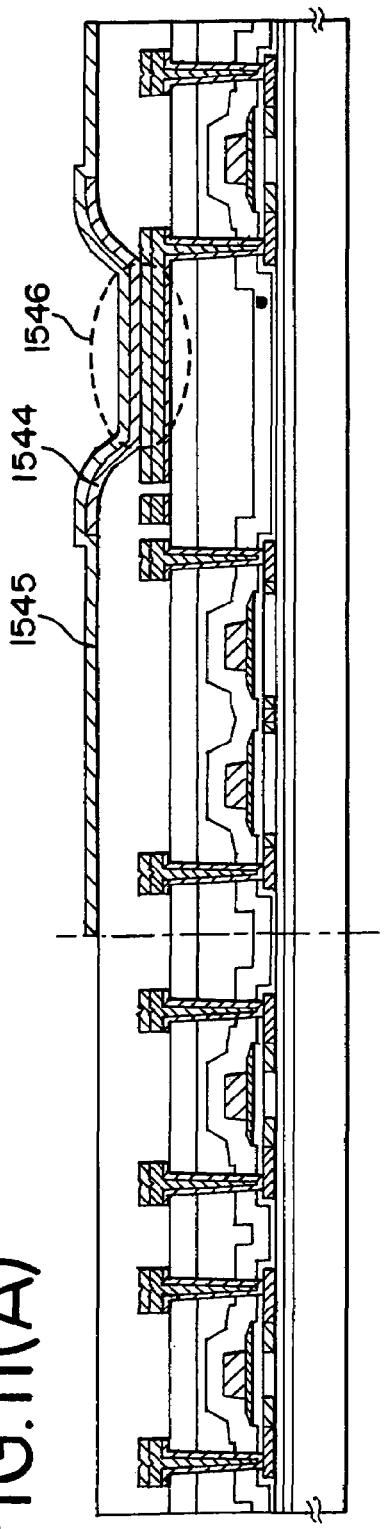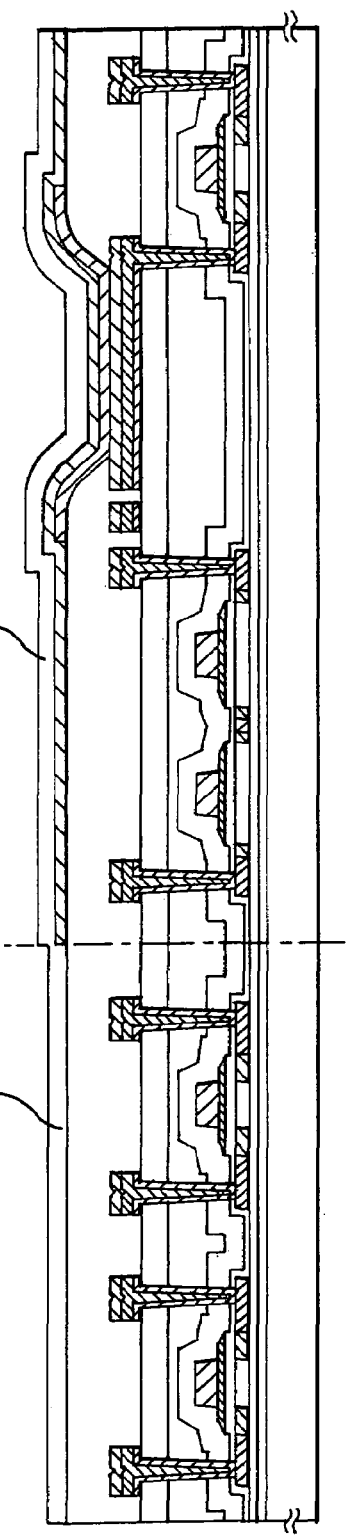

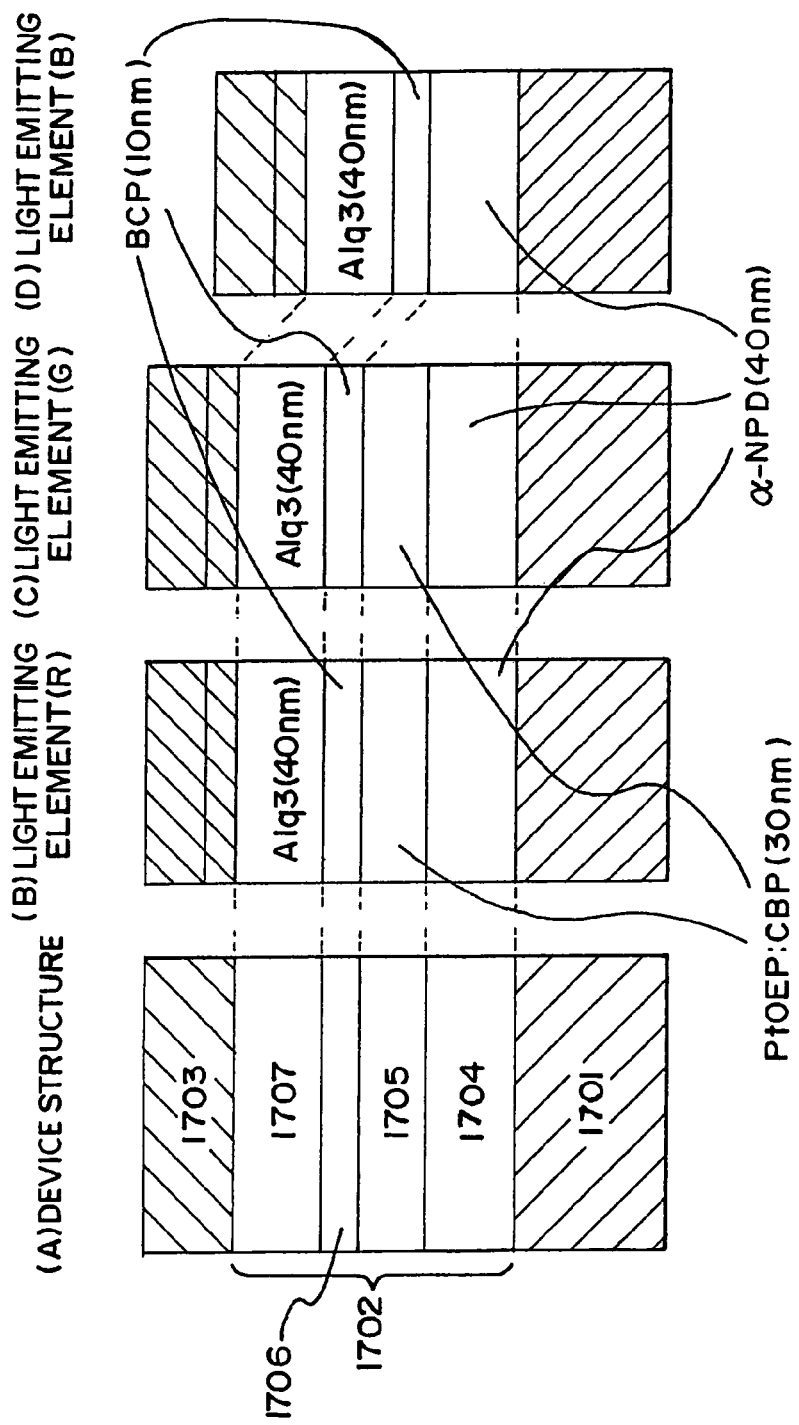

LIGHTING EMITTING DEVICE AND METHOD OF FABRICATING THE SAME

TECHNICAL FIELD OF THE INVENTION

The present invention relates to a lighting emitting device and a method of fabricating the same. Particularly, the present invention relates to a lighting emitting device and a method of fabricating the same of top light emitting type which utilizes an electrode integrated an electrode of a light emitting element and an electrode for transmitting an electronic signal to a TFT for driving a light emitting element.

BACKGROUND OF THE PRESENT INVENTION

A development of an EL display using an electro luminescence (hereinafter, abbreviated as EL) element that is a light emitting element having features such as self-light emitting, a wide viewing angle, high-speed response, low voltage driving ability, and low power consumption has been in the spotlight.

An EL display is classified into a passive matrix type and an active matrix type according to a driving method of an EL element. In addition, it is classified into a top emission type and a bottom emission type according to a method of taking out emitted light. Here, it is referred to as a bottom emission type in case where emitted light is received from a glass substrate side on which an EL element is formed. Moreover, it is referred to as a top emission type in case where emitted light is received from the opposite side of a substrate on which an EL element is formed.

In an active matrix type EL display device, a thin film transistor (hereinafter abbreviated as TFT) is utilized for driving an EL element, and typically, after forming a driving circuit and the like comprising of a TFT on a substrate, an EL element is further formed over the driving circuit. Therefore, in an active matrix type EL display of a bottom emission type, since emitted light can not transmit through a region where a TFT or a wiring is formed, aperture ratio is limited according to the formation of a TFT or a wiring and thereby the amount of light which can be received is limited. On the other hand, in an active matrix type EL display of a top light emitting type, emitted light can be received without any constraints of aperture ratio according to the formation of a TFT or a wiring, and there is also no need to take into consideration of an effect on aperture ratio according to the formation of a TFT or a wiring. Therefore, designing a driving circuit and the like can have more flexibility.

In view of the aforementioned perspective, a development of an active matrix type EL display of a top light emitting type is advanced.

As a structure of an EL element used in an active matrix type EL display of a top light emitting type, a structure where an anode is formed on a substrate side (that is, a side where a TFT is formed) and a light emitting layer, a cathode, and the like are laminated in this order on the anode, and a structure where a cathode is formed on a substrate side and a light emitting layer, an anode, and the like are laminated in this order are conceivable.

As for an EL element, it is preferable to use an anode material in which work function is a conductive material. Therefore, as for an anode material, ITO (Indium Tin Oxide; work function is approximately 4.8 eV) is often used. However, in an EL element which has a structure where an anode is formed on a substrate side (that is, a side where a TFT is formed), then a light emitting layer, a cathode, and the like are laminated in this order, if a transparent conductive material such as ITO is used for an anode, emitted light transmits through the anode and leaks to a side where a TFT is formed. It is proposed to form an anode having a structure where a reflection film is formed under a film formed of ITO (an ITO film) in order to prevent light leak, and to further enhance lighting efficiency by reflecting light emitted to a lighting side.

As a top light emitting type EL display where an EL element having an anode in which an ITO film and a film comprising an opaque conductive material are laminated is used, the anode is formed on a planarizing insulating film on which an electrode (hereinafter, referred to as a source electrode) for transmitting an electric signal to a source (or a drain) of a TFT for driving an EL element is formed. Thereby there is a type where the electrode and the anode are connected through a contact hole (for example, refer to Japanese Patent Laid-Open No. 2000-77191 bulletin (Page 2–4, FIG. 1)).

However, in the aforementioned top light emitting type EL display, since a source electrode and an anode are formed of different layers, steps for forming an interlayer insulating film and a contact hole increase. Therefore, a development of a top light emitting type EL display having a structure that can shorten a step is required.

In view of the aforementioned problem, the object of the present invention is to provide a light emitting device of a top light emitting type integrated an electrode of light emitting element and a source electrode to reduce steps concerning a formation of an interlayer insulating film and a formation of a contact hole, and its manufacturing method.

SUMMARY OF THE INVENTION

In the light emitting device of the present invention, an electrode of a light emitting element and a source electrode are integrated. In addition, the electrode comprises a first conductive film, a second conductive film, and a third conductive film, and the second conductive film and the third conductive film are formed respectively on the first conductive film so as to contact with the first conductive film.

The part where the first conductive film and the second conductive film laminate, functions as the source electrode. Here, the first conductive film functions as a film preventing the second conductive film from directly contacting with a source (or a drain) of a TFT. In addition, the second conductive film functions as a film to transmit an electric signal to the TFT. Because of this, it is desirable for the second conductive film to be formed of a material which has low resistance in order to can function as a wiring.

Although aluminum of a thick film used as a wiring material has low resistance, concavity and convexity due to a hillock is so big that it is unsuitable for a material which forms an electrode of a light emitting element.

However, for example, by assuming the aforementioned structure, it is possible to use a material such as aluminum of a thick film as the second conductive film, even though there is a concern that it might generate a hillock and the like despite its low resistance.

In addition, in the part where the first conductive film and the third conductive film laminate, and function as an electrode of a light emitting element, the first conductive film has an effect of preventing an interlayer insulating film of a lower part of a light emitting element from being etched and preventing concavity and convexity from being formed on the surface of the interlayer insulating film.

The third conductive film functions as a cathode or an anode of a light emitting element.

Here, in a case where the third conductive film is formed of a transparent conductive film, the first conductive film can be used as a reflection film.

In addition, in a case where the third conductive film is a non-transparent conductive film, this may be used as a reflection film.

In addition, a light emitting device of other inventions has a feature having a fourth conductive film sandwiched between the first conductive film and the third conductive film.

The fourth conductive film is used as a reflection film. When the third conductive film is formed of a non-transparent conductive film in such a structure, such as aluminum of a thin film having preferable reflectivity can be used as a reflection film. In addition, if it is aluminum of a thin film, concavity and convexity formed by a hillock of aluminum is one which can be covered with a light emitting layer.

A light emitting device of other inventions has a feature having a first laminating region where a first conductive film and a second conductive film are laminated, and a second laminating region where a third conductive film and a fourth conductive film are laminated. Moreover, a conductive film of either the third conductive film or the fourth conductive film contacts the second conductive film.

BRIEF DESCRIPTION OF THE DRAWINGS

FIG. 8 is a process cross-sectional view describing a fabricating method of a light emitting device of the present invention.

FIG. 9 is a process cross-sectional view describing a fabricating method of a light emitting device of the present invention.

FIG. 10 is a process cross-sectional view describing a fabricating method of a light emitting device of the present invention.

FIG. 11 is a process cross-sectional view describing a fabricating method of a light emitting device of the present invention.

FIG. 12 is a drawing describing an active matrix type EL display manufactured according to the present invention.

FIG. 13 is a drawing describing a structure of a light emitting element of a light emitting device of the present invention.

DETAILED DESCRIPTION OF THE PRESESNTLY PREFERRED EMBODIMENTS

Embodiment Mode 1

A light emitting device according to the present invention is described with reference to FIGS. 1 and 4.

Figure 4:
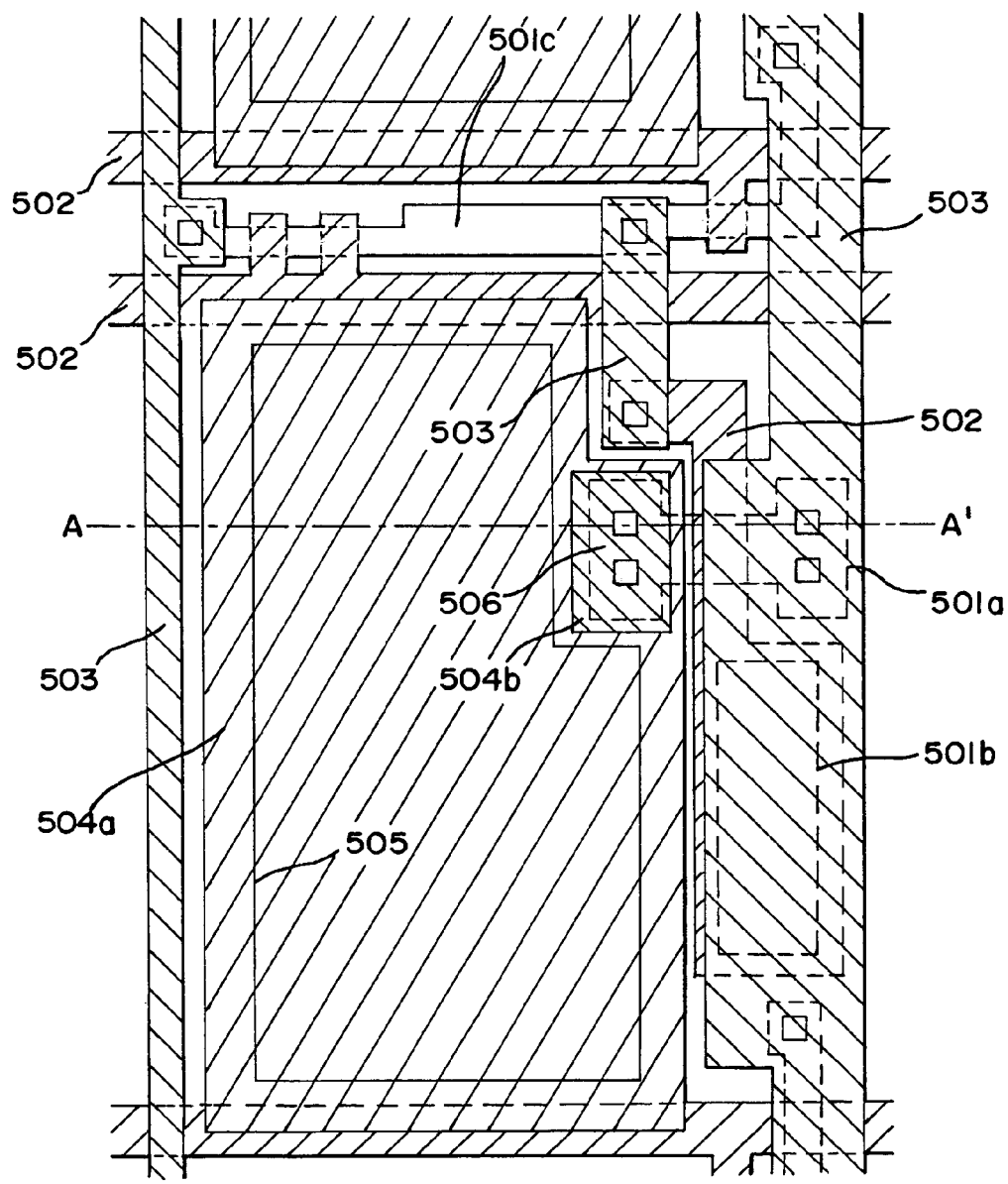
FIG. 4 is a top view describing a light emitting device of the present invention.
Figure 5A:
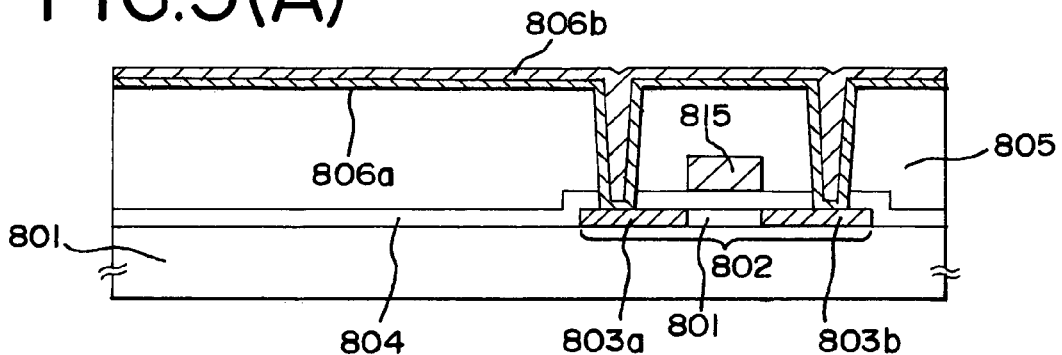
FIG. 5 is a process cross-sectional view describing a fabricating method of a light emitting device of the present invention.
Figure 5B:
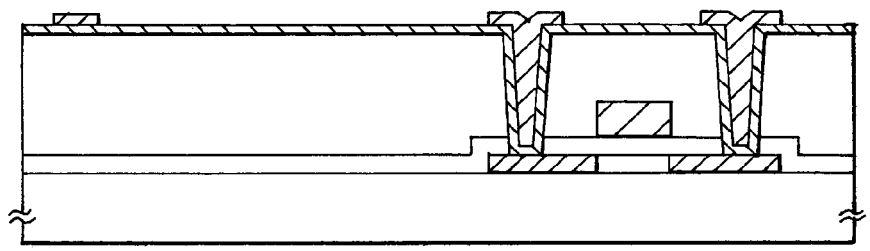
Figure 5C:
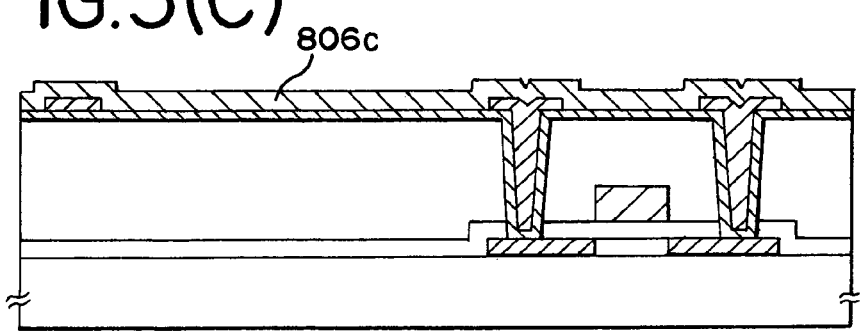
Figure 5D:
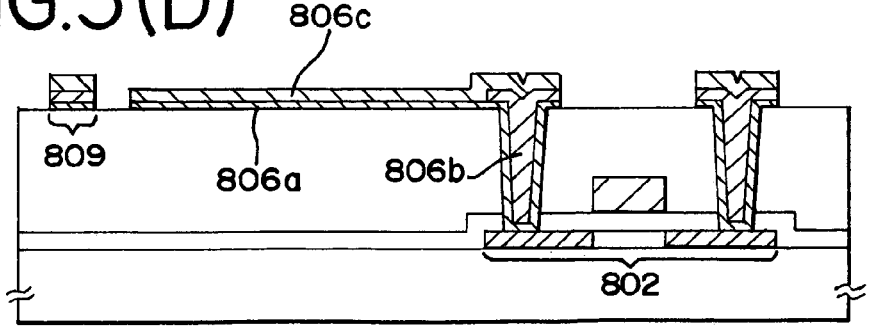

FIG. 4 is a top view of a pixel portion of a light emitting device in the present invention. In FIG. 4, a semiconductor film 501a is a semiconductor film of a transistor for driving a light emitting element (TFT), and a source (or a drain) 506 of the semiconductor film 501a is connected to an electrode 504. The electrode 504 is not provided with an insulating film 505, and comprises a portion 504a which functions as an anode of a light emitting element and a portion 504b which is connected to the source (or a drain) 506 of the TFT.

Figure 1:
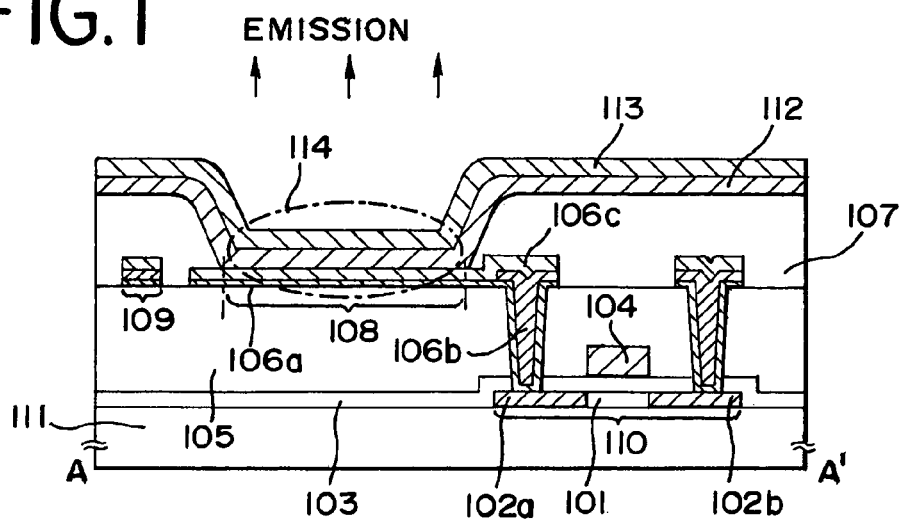
FIG. 1 is a cross-sectional view of a light emitting device of the present invention.

FIG. 1 is a cross-sectional view (A—A') in a pixel portion shown in FIG. 4. In FIG. 1, a thin film transistor (TFT) 110 for driving a light emitting element is provided on a substrate 111, and a source (or a drain) 102a of the TFT 110 is connected to a light emitting element 114 by an electrode 106 integrated an electrode of a light emitting element and a source electrode.

The electrode 106 comprises a conductive film 106a, a conductive film 106b, and a conductive film 106c, and the conductive film 106b and the conductive film 106c are respectively formed on the conductive film 106a to contact with the conductive film 106a.

An insulating film 107 having the opening is formed on the electrode 106 in order to cover ends of the electrode 106. In the opening of the insulating film 107, a laminating part of the conductive film 106a and the conductive film 106c is exposed. An exposed part from the opening of the insulating film 107 functions as an electrode 108 of a light emitting element.

In addition, among the electrode 106, a part where at least the conductive film 106a and 106b are laminated functions as a source electrode of the TFT 110. In addition, as with a part which functions as a source electrode of the TFT 110 (or, also functions as a wiring), a wiring 109 having a structure in which at least the conductive film 106a and 106b are laminated is formed.

Therefore, the conductive film 106b is layered and formed of a material with small specific resistance in thickness of 200 to 400 nm of aluminum or an alloy which contains silicon (Si), titanium (Ti) or the like of a few percentages within aluminum in order that conductive film 106b has low resistance.

Such aluminum or an alloy which has aluminum as its primary component easily causes a defect by contact with silicon (Si). Therefore, the conductive film 106a functions as a film which prevents the conductive film 106b from directly contacting with the source (or the drain) 102a of the TFT.

Furthermore, a conductive film comprised of aluminum or an alloy which has aluminum as its primary component easily causes a hillock. The degree of concavity and convexity due to a hillock varies according to a thickness of a conductive film. In other words, the thicker the film is, the bigger the concavity and convexity is and the thinner the film is, the smaller the concavity and convexity is.

Consequently, when applying a conductive film comprised of aluminum with thick film or an alloy which has aluminum as its primary component to an electrode portion of a light emitting element, a concavity and convexity due to a hillock cannot be entirely covered by a light emitting layer. Thereby, it is concerned that a defect such as shorting out between a cathode and an anode of a light emitting element might be generated.

Hence, in a light emitting device of the present invention, the electrode 108 of a light emitting element has a structure in which the conductive film 106a and the conductive film 106c are laminated.

In addition, the conductive film 106a has an advantageous effect that prevents an interlayer insulating film 105 below a light emitting element from being etched and concavity and convexity from being formed on the surface of the interlayer insulating film 105.

The conductive film 106c can function as a cathode or an anode of a light emitting element. In this embodiment mode, the conductive film 106c is formed of a material with high work function such as ITO (Indium TiN Oxide) (about 4.8 eV), and functions as an anode of a light emitting element.

However, ITO is a transparent conductive film which transmits light. Therefore, the conductive film 106a is used as a reflection film and light emitted from a light emitting element is reflected on a lighting side.

Thus, in the present embodiment mode, the conductive film 106a is formed of a material such as Tantalum or tantalum nitride (TaN) in which reflectivity in a visible light region is comparatively preferable, and reactivity is low with whichever of silicon, aluminum, an alloy having aluminum as its primary component, or ITO.

Furthermore, a light emitting layer 112 is provided so as to contact with the conductive film 106c, and an electrode 113 of a light emitting element is provided on the light emitting layer 112. In the present embodiment mode, the electrode 113 of a light emitting element functions as a cathode of a light emitting element.

In the present embodiment mode, it is noted that a transparent conductive film is used as the conductive film 106c, but in addition to this, an aluminum alloy (Al—Li) may be used as a thin film with a thickness of about 10 to 40 nm. In such aluminum alloy of a thin film, concavity and convexity due to a hillock is small and the concavity and convexity can be covered with the light emitting layer 112. Furthermore, such an aluminum alloy can be used as a reflection film to have high reflectivity.

Thus, the present embodiment mode has the electrode 106 integrated an electrode of a light emitting element and a source electrode. For this reason, steps concerning the formation of an interlayer insulating film and the formation of a contact hole can be reduced than a conventional light emitting device of a top light emitting type in which an electrode of a light emitting element and a source electrode are formed by different layers. Furthermore, considering concavity and convexity formed by an interlayer insulating film being etched, or a hillock generated by aluminum, a structure which can suppress defect of a light emitting element due to these concavity and convexity is adopted.

Embodiment Mode 2

Figure 6A:
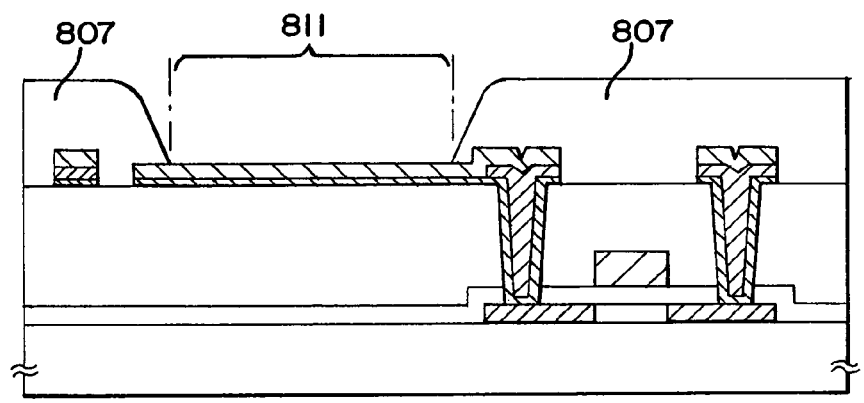
FIG. 6 is a process cross-sectional view describing a fabricating method of a light emitting device of the present invention.
Figure 6B:
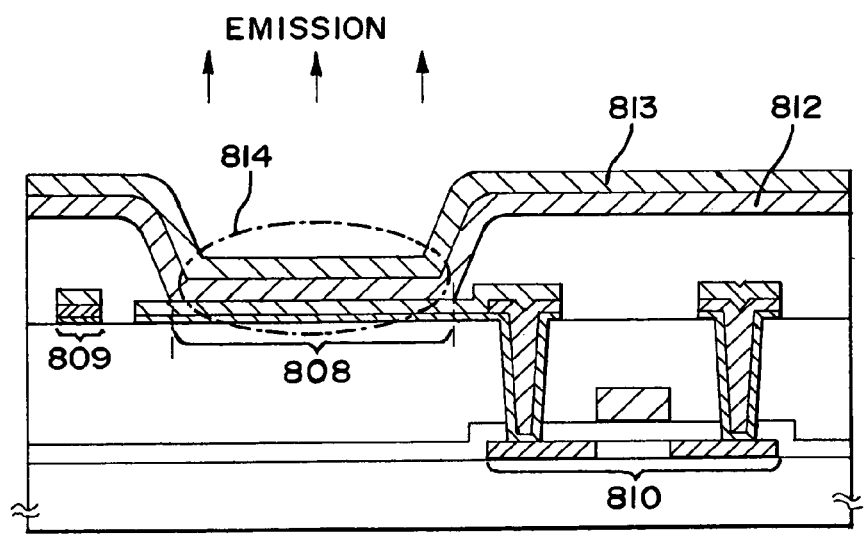
Figure 7A:
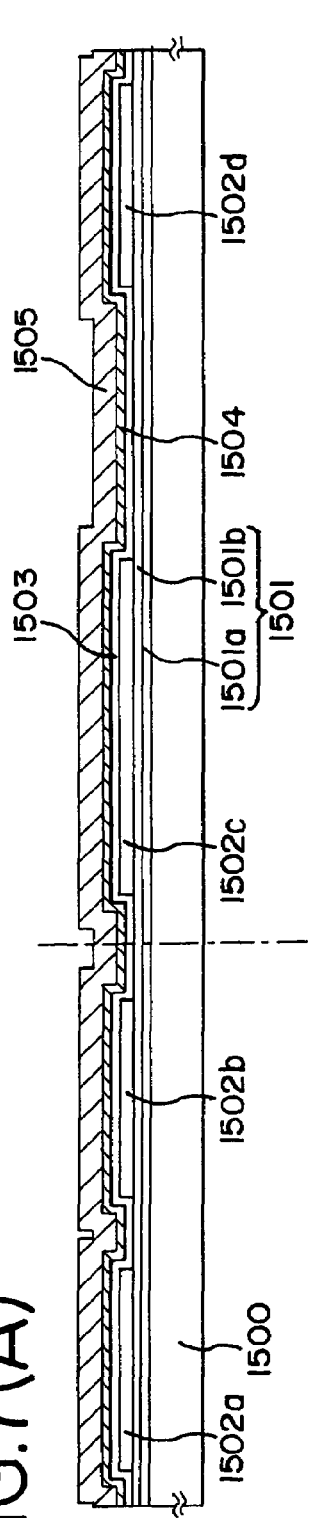
FIG. 7 is a process cross-sectional view describing a fabricating method of a light emitting device of the present invention
Figure 7B:
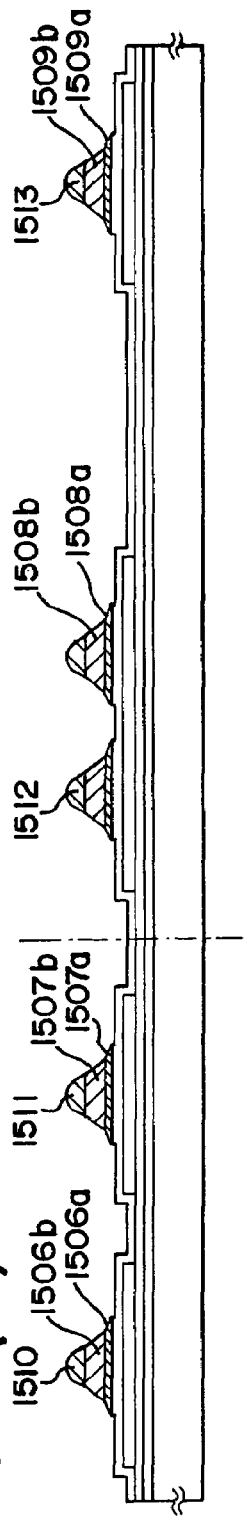
Figure 7C:
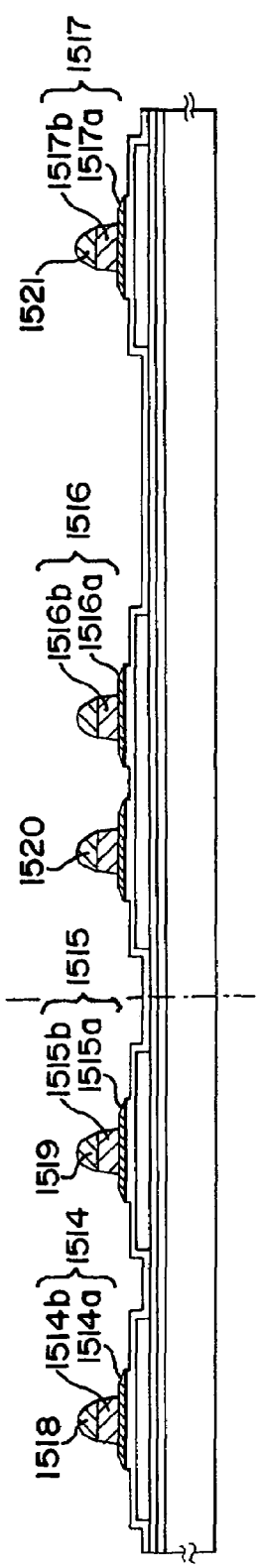

In the present embodiment mode, step cross-sectional views of FIGS. 5 and 6 are used to explain a fabricating method of a light emitting device of a top light emitting type having a structure shown in FIG. 1.

In the present embodiment mode, a structure of TFT is not necessarily limited and it may be manufactured by using a publicly known method.

A TFT 802 for driving a light emitting element is manufactured on a substrate 801 by using a known fabricating method, and an interlayer insulating film 805 comprising an inorganic film or an organic film is further formed thereon. Then a contact hole is formed by patterning and etching in order to electrically connect a source (or a drain) 803a of a TFT and an electrode 808a formed later.

Next, tantalum (Ta) is formed with a film thickness of about 100 nm on the interlayer insulating film 805, and a conductive film 806a (a first conductive film) is formed. Then, aluminum (Al) is formed with a film thickness of about 350 nm on the conductive film 806a, and a conductive film 806b (a second conductive film) is formed. As for the conductive film 806a, other types of materials may be used if the materials have low reactivity with a semiconductor film (a function as a barrier film), light blocking effect, and relatively preferable reflectivity in a visible light region, and does not produce such as hillock. In addition, as for the conductive film 806b, it is not limited to aluminum, and other types of materials may be also used if the materials have low resistance so as to can be used as a wiring without causing any problems (it may vary according to length of a wiring, and the like) such as an alloy which contains silicon (Si), titanium (Ti) or the like of a few percentages within aluminum. In addition, as for the film thickness, it is not limited to the aforementioned value if it can satisfy the aforementioned features.

Then, only the conductive film 806b is manufactured to have a desired shape by patterning or etching. At this time, the conductive film 806a is remained without being etched.

Next, ITO is formed with a film thickness of about 20 nm on the conductive film 806a and the conductive film 806b, thereby a conductive film 806c (a third conductive film) is formed. As for the conductive film 806c, it is not limited to ITO and other types of materials may be used if the materials have high work function (about 4.8 eV or more) so as to can function as an anode of a light emitting element. In addition, a film thickness is also not limited to the aforementioned value if it can function as an anode.

Then the conductive film 806c and the conductive film 806a are manufactured to have a desired shape by etching after patterning. The conductive film 806c and the conductive film 806a may be formed with the use of the same resist mask. The conductive film 806c and the conductive film 806a need not be manufactured with the use of the same resist mask, but a step can be shortened by using the same mask.

Thus, an electrode 806 having a portion in which only the conductive film 806a and the conductive film 806c are laminated is formed. In addition, a wiring 809 which has the shape in which the conductive films 806a, 806b, and 806c are laminated in the same step as the electrode 806 is also formed.

Next, an insulating film 807 with a desired shape comprising a resist with a film thickness of about 1.4 μm is formed on the conductive film 806c. At this time, the insulating film 807 is formed so that a part (a part to be an anode of a light emitting element) of a portion where only the conductive film 806a and the conductive film 806c are laminated is exposed from the insulating film 807. The exposed portion functions as an anode 811 of a light emitting element. As the insulating film 807, except resist, either an inorganic film such as a silicon oxide film or an organic film such as an acrylic may be used. In addition, a film thickness is not limited to the aforementioned value, and it may be suitably adjusted to gain necessary insulation performance and the like.

Then, a light emitting layer 812 is formed on the conductive film 806c, and a cathode 813 is further formed on the light emitting layer 812. The light emitting layer 812 is formed with the use of a known organic compound of low molecular weight system and high molecular weight system. In addition, the cathode 813 is formed of a conductive film in which transmittance to visible light is 40% or more so that light emitted in the light emitting layer 812 can transmit. However, as a material of the cathode 813, the material with low work function is preferable to improve electronic injection efficiency. Therefore, the cathode may be formed with the use of an alloy which contains alkali metal or alkaline earth metal. Alternatively, a transparent conductive film such as ITO may be formed and used as the cathode 813 after forming a thin film comprising alkali metal, alkaline-earth metal, or those compounds to improve electronic injection efficiency between the light emitting layer 812 and the cathode 813.

In this way, a light emitting element 814 laminated in order of the anode 811, the light emitting layer 812, and the cathode 813 is formed.

As described above, a light emitting device of the present invention is manufactured. In this way, in a light emitting device of the present invention, functions as an electrode of a light emitting element and as a source electrode are combined. Thereby, it advantageously enables to reduce steps concerning the formation of an interlayer insulating film and the formation of a contact hole than a conventional light emitting device in which an electrode of a light emitting element and a source electrode are formed by different layers.

Embodiment Mode 3

Figure 2:
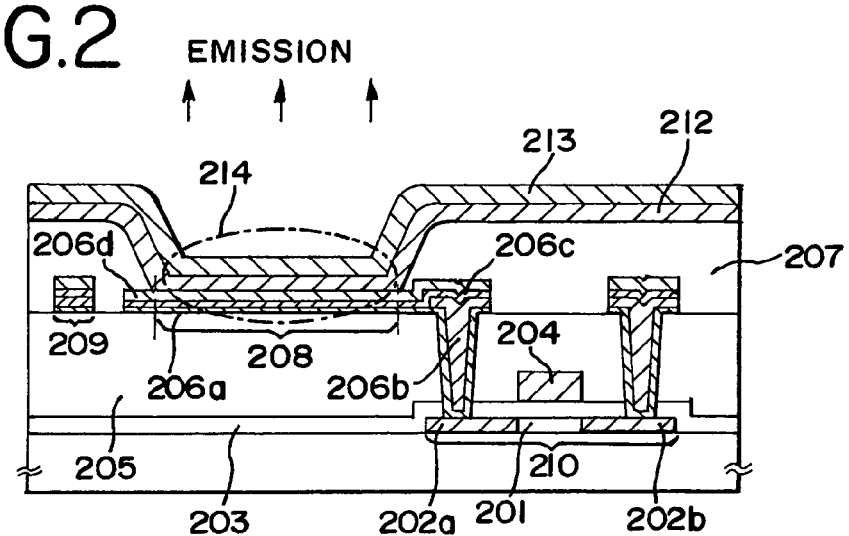
FIG. 2 is a cross-sectional view of a light emitting device of the present invention.

In this embodiment mode, an explain is given about a light emitting device of a top light emitting type having a structure shown in FIG. 2.

In FIG. 2, a thin film transistor (TFT) 210 for driving a light emitting element is provided on a substrate 211. In addition, a source (or a drain) 202a of the TFT 210 is connected to a light emitting element 214 by an electrode 206 integrated an electrode of a light emitting element and a source electrode.

The electrode 206 comprises a conductive film 206a, a conductive film 206b, a conductive film 206c, and a conductive film 206d, and the conductive film 206b and the conductive film 206c are respectively formed on the conductive film 206a so as to contact with the conductive film 206a.

An insulating film 207 having an opening is formed on the electrode 206 to cover an end of the electrode 206. In the opening of the insulating film 207, a lamination part of the conductive film 206a, the conductive film 206d, and the conductive film 206c is exposed. The exposed part from the opening in the insulating film 207 functions as an electrode 208 of a light emitting element.

In addition, a part where at least the conductive films 206a and 206b are laminated among the electrode 206 functions as a source electrode of the TFT 210. In addition, a wiring 209 having a structure in which at least the conductive films 206a and 206b are laminated is formed the same as a part which functions as a source electrode (or functions also as a wiring) of the TFT 210.

A structure of a light emitting device in the present embodiment mode differs from a light emitting device shown in the embodiment mode 1 in terms of having the conductive film 206d.

In the light emitting device of the embodiment mode 1, the conductive film 106c is used as a transparent conductive film, and the conductive film 106a is used as a reflection film. In the present embodiment mode, the conductive film 206d is used as a reflection film.

The conductive film 206d is formed by aluminum of thin film with a thickness of about 10 to 40 nm. Aluminum is suitable for a reflection film as it has high reflectivity. In addition, if the conductive film is aluminum of a thin film, concavity and convexity due to a hillock is small and thereby, a light emitting layer 212 can cover these concavity and convexity without any problems.

The aforementioned structure is effective in case where it is necessary to raise lighting efficiency by forming a reflection film with a material which has higher reflectivity than the conductive film 206a, and furthermore, a transparent conductive film such as ITO is used as the conductive film 206c.

As mentioned above, the present embodiment mode has the electrode 206 integrated an electrode of a light emitting element and a source electrode. Thereby, steps concerning the formation of an interlayer insulating film and the formation of a contact hole can be reduced than a conventional light emitting device of a top light emitting type in which an electrode of a light emitting element and a source electrode are formed by different layers. Moreover, considering concavity and convexity formed by an interlayer insulating film being etched, or a hillock generated by aluminum, a structure which can suppress defect of a light emitting element due to these concavity and convexity is adopted.

Embodiment Mode 4

Figure 3:
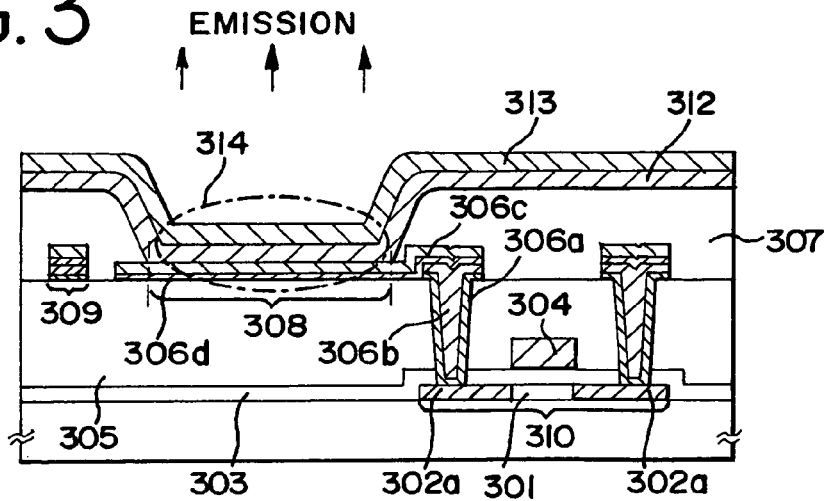
FIG. 3 is a cross-sectional view of a light emitting device of the present invention.

In the present embodiment mode, an explanation is given about a light emitting device of a top light emitting type having the structure shown in FIG. 3.

In FIG. 3, a thin film transistor (TFT) 310 for driving a light emitting element is provided on a substrate 311. In addition, a source (or a drain) 302a of the TFT 310 is connected to a light emitting element 314 by an electrode 306 integrated an electrode of a light emitting element and a source electrode.

The electrode 306 comprises a conductive film 306a, a conductive film 306b, a conductive film 306c, and a conductive film 306d. In addition, the electrode has a portion where the conductive film 306a and the conductive film 306b are laminated, and a portion where the conductive film 306c and the conductive film 306d are laminated, and the conductive film 306d contacts with the conductive film 306b.

An interlayer insulating film 307 having an opening is formed on the electrode 306 to cover an end of the electrode 306. In the opening of the insulating film 307, a lamination part of the conductive film 306d and the conductive film 306c is exposed. The exposed portion from the opening of the insulating film 307 functions as an electrode 308 of a light emitting element.

A structure of a light emitting device in the present embodiment mode differs from the light emitting device shown in the embodiment mode 2 in the way that a part which functions as an electrode of a light emitting element has a structure in which only the conductive film 306d and the conductive film 306c are laminated.

When the conductive film 306a is etched and removed in the lower part of a light emitting element, such a structure may be acceptable in case where concavity and convexity formed on the surface of an interlayer insulating film is not so big that it does not cause defect in a light emitting element.

As described above, the present embodiment mode has the electrode 306 integrated an electrode of a light emitting element and a source electrode. Therefore, steps concerning the formation of an interlayer insulating film and the formation of a contact hole can be reduced than a conventional light emitting device of a top light emitting type in which an electrode of a light emitting element and a source electrode are formed by different layers. Moreover, considering concavity and convexity formed by an interlayer insulating film being etched, or a hillock generated by aluminum, a structure which can suppress defect of a light emitting element due to these considering concavity is adopted.

EMBODIMENTS

Embodiment 1

In the present embodiment, a method of fabricating a light emitting device of a top light emitting type according to the present invention is described with reference to FIGS. 7 to 11. A light emitting device of the present invention has an electrode integrated an electrode of a light emitting element and a source electrode. Therefore, it can be manufactured by reduced steps concerning the formation of an interlayer insulating film and the formation of a contact hole compared to a conventional light emitting device of a top light emitting type in which an electrode of a light emitting element and a source electrode are formed by different layers. Moreover, considering concavity and convexity formed by an interlayer insulating film being etched, or a hillock generated by aluminum, a structure which can suppress defect of a light emitting element due to these concavity and convexity is adopted.

A base insulating film 1501a with a film in thickness of from 50 to 100 nm and a base insulating film 1501b with a film in thickness of from 50 to 100 nm are laminated and formed on a substrate 1500. A base insulating film 1501 (1501a, 1501b) is formed for preventing impurity diffusion from the substrate 1500 to a semiconductor layer. In the present embodiment, a low alkali glass is used, a silicon nitride film with a film in thickness of 100 nm as the base insulating film 1501a and a silicon oxide film with a film in thickness of 100 nm as the base insulating film 1501b are respectively deposited by a plasma CVD method. In the present embodiment, the base insulating film is formed by two lamination layers; however, it may be also one layer or three lamination layers or more in case where impurity diffusion can be prevented. It is noted that materials having transparency such as glass or quartz are used in the manufacturing step of a TFT. However, in the present embodiment, it is not limited to a substrate which has transparency but other types of substrates can be used if the substrates can endure a processing temperature of each step to manufacture a light emitting device of a top light emitting type.

Subsequently, semiconductor films 1502a to 1502d are formed on the base insulating film 1501. An amorphous semiconductor film is formed to deposit semiconductor films 1502a to 1502d by a known formation method (a CVD method, a sputtering method, and the like). Then, crystalline silicon film obtained by a known crystallization method (a solid phase growth method, a laser crystallization method, a solid phase growth method in which nickel is used as a catalyst metal element, or the like) is manufactured and formed to have the semiconductor films 1502a to 1502d a desired shape.

In the present embodiment, an amorphous silicon film with a film in thickness of 55 nm is formed by a plasma CVD method as an amorphous semiconductor film. In addition, aside from the amorphous silicon film, an amorphous semiconductor film such as amorphous silicon germanium ($Si_xGe_{1-x}$(X=0.0001.0.02)) may be used. Alternatively, a crystalline semiconductor film may be formed in stead of obtaining a crystalline semiconductor film by crystallizing an amorphous semiconductor film. As for a film thickness, it may be suitably changed without being limited to the aforementioned film thickness.

In addition, a solid phase growth method (a heat treatment at 550° C. for 4 hours) in which nickel is used as a catalyst metal element is carried out to crystallize an amorphous silicon film. Further, a process by an excimer laser carries out to improve crystallinity and a crystalline silicon film is obtained.

Next, a thin oxide film with a film in thickness of 1 to 2 nm is formed on the surface of the crystalline silicon film with the use of ozone water. In addition, an amorphous silicon film with a film thickness of 100 nm is further formed thereon by sputtering. Then, a heat treatment is performed at 550° C. for 4 hours by furnace to move a catalyst metal element contained in the crystalline silicon film into the amorphous silicon film (a gettering processing). After the gettering processing, the unnecessary amorphous silicon film (there is a case that it becomes a crystalline silicon film by an effect of a catalyst metal element after a gettering processing) is removed with the use of a TMAH solution and is further removed by the use of hydrofluoric acid solution.

Next, the crystalline silicon film is manufactured in a desired shape by patterning with the use of photolithography and etching to form the semiconductor films 1502a to 1502d.

In addition, an impurity may be added (channel dope) to control threshold of the TFT before forming the semiconductor films 1502a to 1502d or after forming the semiconductor films 1502a to 1502d. Boron, phosphorus or the like may be used as an impurity to be added.

When a crystalline semiconductor film is formed by a laser crystallization method, a pulse oscillation type or a continuous oscillation type laser that uses excimer (XeCl), YAG, or $YVO_4$ can be used as a laser medium. When an excimer laser is used, pulse oscillation frequency may be set to about 300 Hz and a laser energy density may be set to from 100 mJ/cm$^2$ to 400 mJ/cm$^2$. When a YAG laser is used, its second harmonic may be used, pulse oscillation frequency may be set to from 30 Hz to 300 Hz, and a laser energy density may be set to from 300 mJ/cm$^2$ to 600 mJ/cm$^2$. The allover face of the substrate may be irradiated with linear laser beam that is linearly condensed to have a width from 100 μm to 1000 μm. At this time, an overlap ratio of the linear laser beam may be set to from 50% to 90%.

Next, a gate insulating film 1503 is formed to cover the semiconductor films 1502a to 1502d. In the present embodiment, a silicon oxide film with a film thickness of 110 nm is deposited to form the gate insulating film by using a plasma CVD method. Note that it is not limited to a silicon oxide film, and other insulating films may be used. The film thickness is not limited to the above-mentioned value, and can be properly changed in consideration of the dielectric constant and the like.

Next, a conductive film 1504 and a conductive film 1505 are laminated and formed on the gate insulating film 1503. In the present embodiment, tantalum nitride (TaN) is formed with a film thickness of 30 nm by sputtering to form the conductive film 1504, and tungsten (W) is formed with a film thickness of 370 nm by sputtering likewise to form the conductive film 1505. A material used for forming the conductive films 1504 and 1505 are not limited to tantalum nitride or tungsten, and an element selected from the group consisting of Ta, W, Ti, Mo, Al, Cu, Cr and Nd, an alloy film in which the above elements are combined, a compound material, or a semiconductor film represented by a polycrystalline silicon film to which an impurity element such as phosphorus is added may be used. A material having higher adhesion to the gate insulating film may be selected as the conductive film 1504 and a material having lower resistance in which a value of resistance with approximately 9 to 20 $\mu\Omega.cm$ is obtained can be selected as the conductive film 1505.

Then, the conductive films 1504 and 1505 are manufactured in a desired shape by patterning and etching. First, resist masks 1510 to 1513 having sloping side walls are formed. Then, the conductive film 1505 is etched by using the resist masks 1510 to 1513 as masks, and the conductive film 1504 is manufactured by etching. The conductive film 1505 is etched to form conductive films 1506b, 1507b, 1508b, and 1509b each of which has a taper angle of approximately 26° in its side wall corresponding to the sloping angle (taper angle) of side walls of resist masks 1510 to 1513. Moreover the conductive film 1504 is also etched to form the conductive films 1506a, 1507a, 1508a, and 1509a each of which has a taper angle of 15° to 45° in its side wall.

Next, the conductive films 1506b, 1507b, 1508b, and 1509b are selectively etched by using resist masks 1518 to 1521 as masks. Therefore, the conductive films 1506b, 1507b, 1508b, and 1509b etched to form the conductive films 1514b, 1515b, 1516b, and 1517b each of which has almost perpendicular side wall respectively. In this case, anisotropic etching mainly etched in a perpendicular direction has to be used. Also, the resist masks 1510 to 1513 which are used for etching in the above conductive films 1504 and 1505 are directly used for the resist masks 1518 to 1521. The conductive films 1506a, 1507a, 1508a, and 1509a are not processed and remained as conductive films 1514a, 1515a, 1516a and 1517a.

As described above, a gate electrode 1514 formed of the conductive films 1514a and 1514b, a gate electrode 1515 formed of the conductive films 1515a and 1515b, a gate electrode 1516 formed of the conductive films 1516a and 1516b, and a gate electrode 1517 formed of the conductive films 1517a and 1517b are formed.

Next, low concentration n-type impurities are doped using the gate electrodes 1514 to 1517 as masks. In the present embodiment, phosphorus at concentration of $1 \times 10^{17}$ atoms/cm$^3$ is added into the semiconductor films 1502a to 1502d as a low concentration impurity to form low concentration impurity regions 1522a to 1522d. The low concentration impurities doping is performed to form an LDD (Light Doped Drain) region for controlling off leak current of a TFT. The off leak current is changed according to the doped impurities concentration. Therefore, the amount of the doping impurities may be properly changed so that the value of the off leak current does not exceed the provision value. In the present embodiment, phosphorus is used as an n-type impurity, however it is not limited to this and other impurities may be used.

The high concentration n-type impurities are doped using resist masks 1525 to 1527 and the conductive film 1514b as masks. The resist mask 1525 is formed to cover the semiconductor film 1502b and the gate electrode 1515, the resist mask 1526 is formed to cover a part of the semiconductor film 1502c (a part to be an LDD region of a TFT) and the gate electrode 1516. In addition, the resist mask 1527 is formed to cover the semiconductor film 1502d and the gate electrode 1517. In the present embodiment, high concentration phosphorus of $1 \times 10^{20}$ atmos/cm$^3$ is doped into the region in the semiconductor film 1502a over which the conductive film 1514a is not formed, and the region in the semiconductor film 1502c over which the resist mask 1526 are not formed. At the same time, low concentration phosphorus of $1 \times 10^{18}$ atmos/cm$^3$ is doped into the region in the semiconductor film 1502a over which the conductive film 1514a is formed. As a result, a source (or a drain) 1523a including high concentration phosphorus, and a low concentration impurity region 1524 including low concentration phosphorus are formed. The difference of the blocking capacity toward impurities to be doped, between the region in which the conductive film 1514a is formed and the region in which the conductive film is not formed, is utilized. In the present embodiment, phosphorus is used as an n-type impurity, however, it is not limited to this and other impurities may be used.

Then, high concentration p-type impurities are doped using resist masks 1530 and 1531 and the conductive films 1515b and 1517b as a mask. The resist mask 1530 is formed to cover the semiconductor film 1502a and the gate electrode 1514, and the resist mask 1531 is formed to cover the semiconductor film 1502c and the gate electrode 1516. In the present embodiment, high concentration boron of $1 \times 10^{20}$ atoms/cm$^3$ is doped into the region of the semiconductor films 1502b and 1502d over which the conductive films 1515a and 1517a are not formed in order to form sources (or drains) 1528a and 1528b. At the same time, low concentration boron of $1 \times 10^{19}$ atoms/cm$^3$ is doped into the region of the semiconductor films 1502b and 1502d over which the conductive films 1515a and 1517a are formed in order to form low concentration impurity regions 1529a and 1529b. In the present embodiment, boron is used as a p-type impurity, however, it is not limited to this and other impurities may be used.

As describe above, TFTs 1550 to 1553 are manufactured. The TFTs 1550 and 1551 are the TFTs for driving a circuit, and the TFT 1552 and the TFT 1553 are the TFTs for driving a light emitting element.

Then, heat treatment is performed for activating the added impurities. In the present embodiment, the heat treatment with a furnace at 550° C. for 4 hours is performed in a nitrogen atmosphere that has an oxygen concentration of 0.1 ppm or less in order to prevent the gate electrodes 1514 to 1517 from being oxidized. When an insulting film such as a silicon oxide film is formed on the TFTs 1550 to 1553 in order to prevent oxidation of the gate electrodes 1514 to 1517, the oxygen concentration may range no less than 0.1 ppm and no more than 1 ppm. Instead of the heat treatment with a furnace, other methods such as activation with a laser or RTA (Rapid Thermal Annealing) may be used.

Next, an interlayer insulating film 1532 is formed to cover the TFTs 1550 to 1553. In the present embodiment, a plasma CVD method is used for deposition to form a silicon nitride oxide film (SiNO) with a film thickness of 100 nm. In addition, the interlayer insulating film is not limited to the silicon nitride oxide film, other insulating films may be used. The film thickness is not limited to the aforementioned value, but may also be changed properly in consideration of a dielectric constant and the like.

Then, hydrogenation is performed for terminating dangling bonds of the semiconductor films. In the present embodiment, heat treatment at 410° C. for 1 hour is performed in an atmosphere of 100% hydrogen to conduct hydrogenation. Instead of hydrogenation by heat treatment, hydrogenation with plasma may be performed.

Next, an interlayer insulating film 1535a is formed on the interlayer insulating film 1532. In the present embodiment, a plasma CVD method is used to form a silicon oxide film with a film thickness of 1.2 μm, and thereupon CMP (Chemical Mechanical Polishing) is used to polish and planarize the surface of the interlayer insulating film. Thereby, the interlayer insulating film 1533 is formed. In addition, the interlayer insulating film is not limited to the silicon oxide film, but may also be formed by using other insulating films. The film thickness is not limited to the aforementioned value, but may also be changed properly in consideration of a dielectric constant, amount of the film to be reduced by planarization, or the like.

Further, an interlayer insulating film 1534 is formed on the interlayer insulating film 1553. In the present embodiment, the interlayer insulating film 1534 is formed by depositing a silicon oxide film with a film thickness of 600 nm by using a plasma CVD method. In addition, the interlayer insulating film is not limited to the silicon oxide film, but may also be formed by using other insulating films. The film thickness is not limited to the aforementioned value, but may also be changed properly in consideration of a dielectric constant and the like.

Then, contact holes which reach sources (or drains) 1523a, 1523b, 1528a, and 1528b are formed by patterning and etching. In the present embodiment, the interlayer insulating films 1533 and 1534 are etched by a wet process with the use of a solution containing fluorinated acid after patterning, and then the interlayer insulating film 1532 is etched by a dry process to form the contact holes.

Then, a wiring to transmit an electric signal to the TFTs 1550 to 1553, a source (or a drain) electrode, and an anode of a light emitting element are formed.

After forming the contact holes, a first conductive film 1535a and a second conductive film 1535b are formed on the interlayer insulating film 1534. In the present embodiment, tantalum (Ta) is formed with a film thickness of 100 nm by sputtering to form the first conductive film 1535a. In addition, an aluminum alloy with a film thickness of 250 nm containing a few percentages of silicon is formed to form the second conductive film 1535b.

Next, the second conductive film 1535a is selectively etched and processed by using the resist mask formed by a patterning using a photolithography method as a mask and second conductive films 1536b, 1537b, 1538b, 1539b, 1540b, and 1541b are formed. In the present embodiment, the second conductive film 1535b is selectively etched by using solution containing 2.0% of nitric acid ($HNO_3$) in which the solution is kept at the temperature of 45° C., 9.8% of acetic acid ($CH_3CHOOH$), and 72.3% of phosphoric acid ($H_3PO_4$). Therefore, the second conductive film is removed from a region to be an anode of a light emitting element. Note that etching by a dry method may be utilized aside from the aforementioned etching by a wet method. In addition, solution aside from the aforementioned one may be also used in etching by a wet method.

Then, a third conductive film is formed to cover the first conductive film 1535b, and the second conductive films 1536b, 1537b, 1538b, 1539b, 1540b, and 1541b. In the present embodiment, amorphous ITO (Indium Tin Oxide) is formed with a film thickness of 20 nm by sputtering to form the third conductive film.

Next, the third conductive film 1535c is selectively etched and processed by using the resist mask formed by a patterning using a photolithography method as a mask and third conductive films 1536c, 1537c, 1538c, 1539c, 1540c, and 1541c are formed. In the present embodiment, the third conductive film 1535c is selectively etched by using solution containing oxalic acid (($COOH)_2$) less than or equal to 5% which is kept at the temperature of 45° C. Note that etching by a dry method may be utilized aside from the aforementioned etching by a wet method. In addition, solution aside from the aforementioned one may be also used in etching by a wet method.

Next, the first conductive film 1535a is selectively etched with the use of the same resist mask used in the etching of the third conductive film 1535c to form first conductive films 1536a, 1537a, 1538a, 1539a, 1540a, and 1541a. In the present embodiment, the first conductive film 1535a is selectively etched using dry etching.

In addition, as the first conductive film 1535a, aside from tantalum, a material such as titanium (Ti) having a function as a barrier film which does not cause defect by contact with silicon of the sources (or drains) 1523a, 1523b, 1528a, and 1528b under the condition of low temperature (about equal to or less than 250° C.) may be used. Moreover, it is preferable to have reflectivity in a visible light as high as possible in order to can function as a reflection film. Furthermore, concerning the second conductive film 1535b, a material aside from silicon such as an aluminum alloy containing titanium and the like may also be used if it has a low resistance value so as to can function as a wiring. Concerning the third conductive film 1535c, a material aside from ITO may also be used if it has high work function (preferably equal to or more than 4.8 eV) so as to can function as an anode of a light emitting element.

Next, baking is performed to crystallize ITO. In the present embodiment, amorphous ITO which is a material of the third conductive films 1536c, 1537c, 1538c, 1539c, 1540c, and 1541c is crystallized by baking at the temperature of 250° C. for 2 hours. At the baking time, an aluminum alloy which is a material of the second conductive film generates a hillock. However, as mentioned above, the second conductive film is removed from the region to be an anode of a light emitting element among the third conductive films 1536c, 1537c, 1538c, 1539c, 1540c, and 1541c in the present embodiment. Therefore, a portion to be an anode of a light emitting element will not be affected even if an aluminum alloy generates a hillock. In addition, in the present embodiment, concavity and convexity is fully covered with an insulating film 1542 manufactured in a later process even if an aluminum alloy generates a hillock in a region aside from a region to be an anode of a light emitting element.

In this way, an electrode 1536 integrated a source electrode to transmit an electric signal to the source (or the drain) 1528b of the TFT 1553 and an electrode of a light emitting element is formed. At the same time, source electrodes 1538 to 1541 (however, the source electrodes 1538 to 1541 also function as wirings) to transmit an electric signal to the sources (or, drains) 1523a, 1523b, and 1528a of the TFTs 1550 to 1552, and a wiring 1537 are formed.

Next, an insulating film 1542 provided with an opening is formed so that a portion of the electrode 1536 (a portion to be an anode of a light emitting element) is exposed. In the present embodiment, resist is processed with the use of a photolithography method to form the insulating film 1542 with a film thickness of 1.4 μm. In addition, apart from resist, organic resin materials such as acrylic (including both photosensitivity and non-photosensitivity) or polyimide (including both photosensitivity and non-photosensitivity), and inorganic materials such as silicon oxide film may be used to form the insulating film. In addition, in the present embodiment, an edge portion of the insulating film 1542 has a shape which is not square but round. Moreover, the electrode 1536 exposed in the opening of the insulating film 1542 functions as an anode 1543 of a light emitting element.

Then, an organic compound layer is formed by a vapor deposition method on the anode 1543. Here, in the present embodiment, a condition in which a kind of an organic compound layer is formed among organic compound layers formed by organic compounds which show three kinds of luminescence, red, green, and blue is shown. A combination of organic compounds which form three kinds of organic compound layers is described in FIG. 13.

In addition, a light emitting element shown in FIG. 13(A) comprises an anode 1701, an organic compound layer 1702, and a cathode 1703, and the organic compound layer 1702 has a laminated structure of a hole transport layer 1704, a light emitting layer 1705, and an electron transport layer 1706. In addition, FIG. 13(B) shows a material and a film thickness comprising a light emitting element showing red luminescence, FIG. 13(C) shows a material and a film thickness comprising a light emitting element showing green luminescence, and FIG. 13(D) shows a material and a film thickness comprising a light emitting element showing blue luminescence respectively.

First, an organic compound layer showing red luminescence is formed. Specifically, a 4,4'-bis [N-(a-naphthyl)-N-phenyl-amino]-biphenyl (hereinafter referred to as α-NPD) as a hole transporting organic compound is formed into the hole transporting layer 1704 in a 40 nm film thickness. A 2, 3, 7, 8, 12, 13, 17, 18-octaethyl-21H, 23H-porphyrin-platinum (hereinafter referred to as the PtOEP) as a light emitting organic compound is deposited by a co-vapor deposition to form the light emitting layer 1705 with a 4,4'-dicarbozol-biphenyl (hereinafter referred to as the CBP) of a organic compound (hereinafter referred to as the host material) to serve as the host in a 30 nm film thickness. A basocuproin (hereinafter referred to as the BCP) as a blocking organic compound is formed into a blocking layer 1706 in a 10 nm film thickness. A tris (8-quinolinolato) aluminum (hereinafter referred to as the $Alq_3$) as an electron transporting organic compound is formed into an electron transporting layer 1707 in a 40 nm film thickness. Thereby, an organic compound layer with red luminescence can be formed.

Although the case of forming an organic compound layer with red luminescence using 5 kinds of organic compounds with different functions is described here, the present invention is not limited to this, and known materials can be used as the organic compound showing the red luminescence.

Next, an organic compound layer showing green luminescence is formed. Specifically, an α-NPD as a hole transporting organic compound is formed into the hole transporting layer 1704 in a 40 nm film thickness. The light emitting layer 1705 using a CBP as a hole transmitting host material is deposited by the covapor deposition with a tris (2-phenyyl pyridine) iridium ($Ir(ppy)_3$) in a 30 nm film thickness. A BCP as a blocking organic compound is formed into the blocking layer 1706 in a 10 nm film thickness. An $Alq_3$ as an electron transporting organic compound is formed into the electron transporting layer 1707 in a 40 nm film thickness: Thereby, an organic compound layer with green luminescence can be formed.

Although the case of forming an organic compound layer with green luminescence using 5 kinds of organic compounds with different functions is described here, the present invention is not limited to this, and known materials can be used as the organic compound showing the green luminescence.

Next, an organic compound layer showing blue luminescence is formed. Specifically, an αNPD as a light emitting organic compound and a hole transporting organic compound is formed into the light emitting layer 1705 in a 40 nm film thickness. A BCP as a blocking organic compound is formed into the blocking layer 1706 in a 10 nm film thickness. An $Alq_3$ as an electron transporting organic compound is formed into the electron transporting layer 1707 in a 40 nm film thickness. Thereby, an organic compound layer with blue luminescence can be formed.

Although the case of forming an organic compound layer with blue luminescence using 3 kinds of organic compounds with different functions is described here, the present invention is not limited to this, and known materials can be used as the organic compound showing the blue luminescence.

By forming the above mentioned organic compounds on the anode, an organic compound layer showing the red luminescence, the green luminescence and the blue luminescence can be formed in the pixel portion.

Next, a cathode 1545 is formed to cover an organic compound layer 1544 and the insulating layer 1542. In the present embodiment, the cathode 1545 is formed of ITO having high transmittance to visible light. ITO is not suitable for a cathode since it is a material with high work function. Therefore, in the present embodiment, lithium fluoride is formed with a film thickness of 2 nm so as to cover the organic compound layer 1544 and the insulating layer 1542 before forming the cathode 1545 in order to improve electron injection efficiency.

In addition, apart from ITO, a material belonging to alkali metal or alkaline-earth metal may be used alone, laminated with other materials, or an alloy formed with other materials (for example, an Al: Ag alloy, an Al: Mg alloy, a Mg: In alloy, or the like) may be used with thin film. In addition, apart from the aforementioned materials, other materials may be used to form the cathode 1545 if the materials are conductive films with low work function and high transmittance to visible light.

Then, a protective film 1546 is formed to protect a light emitting element. In the present embodiment, a silicon nitride film is formed by sputtering to form the protective film 1546. In addition, the protective film 1546 may be formed with the use of other materials such as DLC (Diamond like Carbon) apart from the silicon nitride film.

In this way, a light emitting device of a top light emitting type in which a fabricating method of the light emitting device of the present invention is utilized is manufactured.

Embodiment 2

In the present embodiment, an active matrix type EL display of a top light emitting type manufactured according to the present invention is described with reference to FIG. 12. Such an active matrix type EL display of a top light emitting type has preferable lighting efficiency as it is provided with a reflection film. In addition, manufacturing cost is reduced since an electrode of a light emitting element, a source electrode, and a wiring are formed at the same time. Furthermore, concerning concavity and convexity formed by an interlayer insulating film being etched, or a hillock generated by aluminum in a manufacturing process, a structure which can suppress defect caused due to these concavity and convexity is adopted to improve yield.

Figures 12A, 12B:
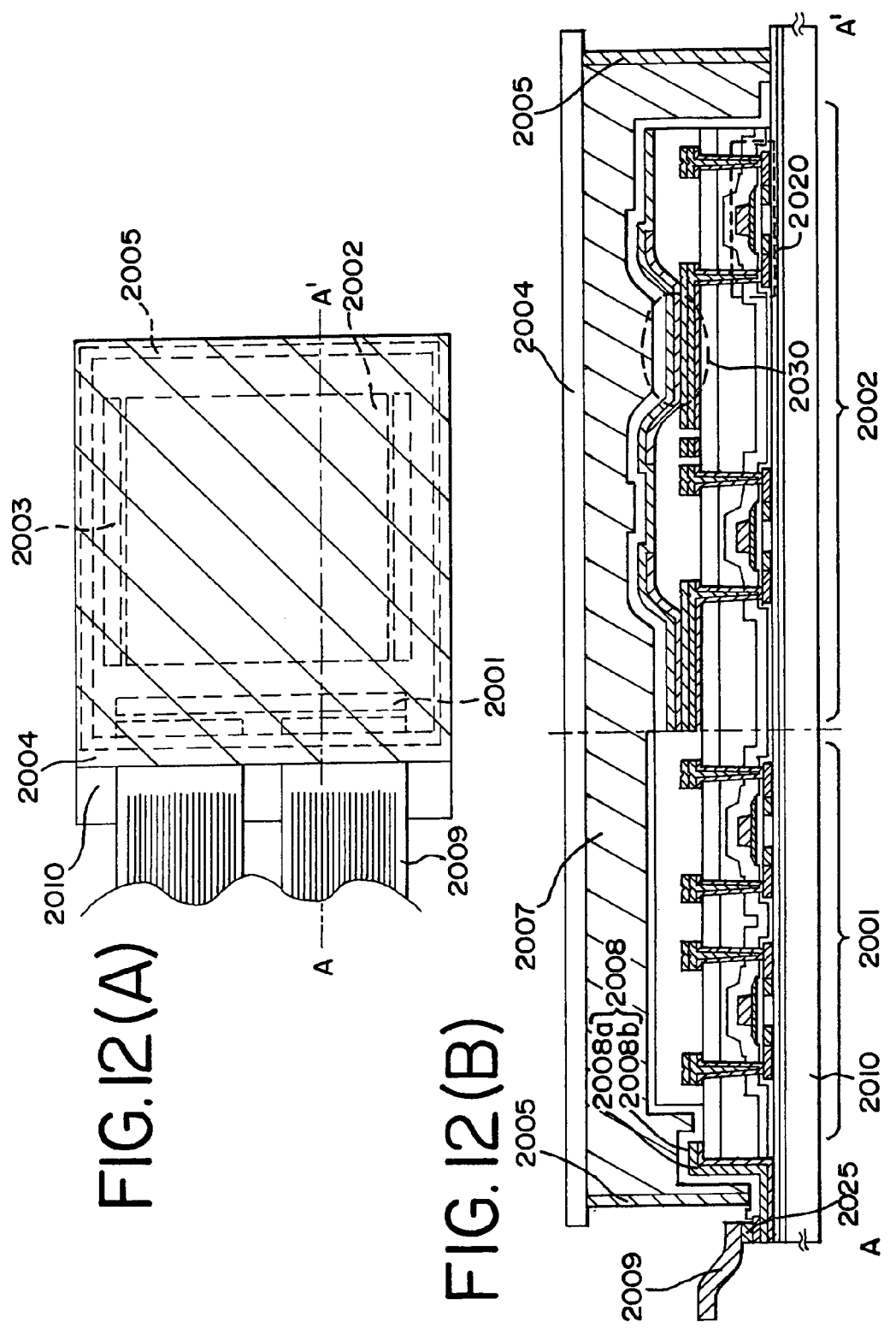

FIG. 12(A) shows a top view of the light emitting device, FIG. 12(B) is a cross-sectional view taken on line A—A' of FIG. 12(A). Reference number 2001 shown by a dotted line denotes a source signal line driver circuit; 2002 denotes a pixel portion; and 2003 denotes a gate signal line driver circuit. In addition, reference numeral 2004 denotes a sealing substrate; 2005 denotes a sealant; inside surrounded by the sealing substrate 2004 and the sealant 2005 is a space.

Reference numeral 2008 (2008a, 2008b) is a wiring for transmitting a signal inputted to the source signal line driver circuit 2001 and the gate signal line driver circuit 2003, and receives a video signal or a clock signal from a FPC (flexible print circuit) 2009 to be an external input terminal. Only the FPC is illustrated here, but a printed wiring board (PWB) may be attached to this FPC. The light emitting device referred to in the present specification is included not only the body of the light emitting device, but also a light emitting device which an FPC or a PWB is attached to the body of the light emitting device.

The following describes a sectional structure, referring to FIG. 12(B). A driver circuit and a pixel portion are formed on a substrate 2010, but the source signal line driver circuit 2001 and the pixel portion 2002 are here shown as a driver circuit. In the source signal line driver circuit 2001, a CMOS circuit in which an n-channel type TFT and a p-channel type TFT are combined is formed. TFTs constituting a driver circuit may comprise known CMOS circuits, PMOS circuits, or NMOS circuits. In the present embodiment, a driver-integrated type where the driver circuit is formed on the substrate is illustrated, but the driver-integrated type need not be adopted. The driver may be fitted not on the substrate but to the outside. The pixel portion 2002 is formed of plural pixels including an electrode integrated a source electrode for transmitting an electric signal to a TFT 2020 for driving a light emitting element and an anode of light emitting element 2030.

The cathode and the anode are electrically connected to the FPC through a connection wiring. In FIG. 12(B), the anode and the FPC 2009 are electrically connected through the connection wiring 2008.

In order to seal the light emitting element 2030, the sealing substrate 2004 is adhered to the substrate with the sealant 2005. A spacer made of a resin film may be set up to keep a given interval between the sealing substrate 2004 and the light emitting element 2030. An inert gas such as nitrogen is filled into a space 2007 inside the sealant 2005. As the sealant 2005, an epoxy resin is preferably used. In addition, the sealant 2005 is desirably made of a material through which moisture or oxygen is transmitted as hardly as possible. Furthermore, it may be possible for the inside of the space 2007 to include a material having oxygen or moisture absorption effect.

In the present embodiment, as the material constituting the sealing substrate 2004, aside from a glass substrate and a quartz substrate, a plastic substrate made of FRP (Fiberglass-Reinforced Plastics), PVF (polyvinyl fluoride), mylar, polyester, polyacrylic, or the like can be used. After the adhesion of the sealing substrate 2004 to the substrate with the sealant 2005, it is possible to further seal with a sealant so as to cover the side faces (exposure faces).

As described above, the light emitting element is sealed into the space 2007, so that the light emitting element can be completely shut out from the outside and materials promoting deterioration of the organic compound layer, such as moisture or oxygen, can be prevented from invading this layer from the outside. Consequently, the light emitting device can be made highly reliable.

In addition, there is no limitation concerning an n-channel type TFT, a p-channel type TFT, and a TFT for driving a light emitting element, and any structures such as a single drain structure, an LDD structure, a single gate structure, a double gate structure can be applied.

Embodiment 3

In the present embodiment, it describes an electronics device equipped with an active matrix type EL display manufactured according to the present invention with reference to FIG. 14. An active matrix type display manufactured according to the present invention has high lighting efficiency. Therefore, electric power consumption concerning display can be reduced. Therefore, available time under the condition of the use of battery can be extended in mobile devices such as a cellular phone or a Personal Digital Assistant (PDA). In addition, it is possible to display a clearer image by enhancing lighting efficiency of a television or a monitor. Furthermore, price-reduction can be achieved because the manufacturing cost is reduced.

Figure 14A:
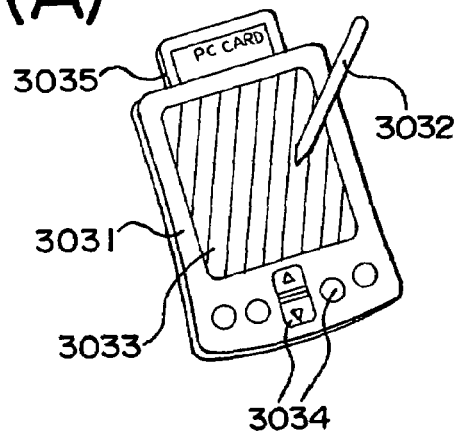
FIG. 14 is a drawing describing an electronics device to which the present invention is applied.
Figure 14B:
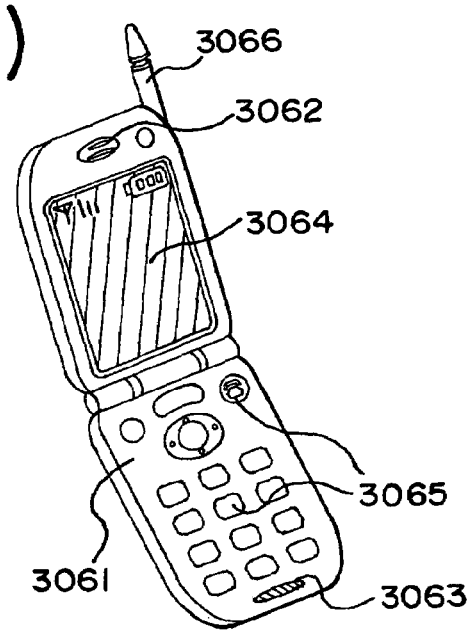

FIG. 14(A) is a Personal Digital Assistant (PDA) manufactured according to the present invention, and its body 3031 is provided with a display portion (an active matrix type EL display according to the present invention) 3033, an outside interface 3035, operation buttons 3034, and the like. A stylus 3032 is an attachment for operation. In addition, FIG. 14(B) is a cellular phone manufactured according to the present invention. A body 3061 is provided with a display portion (an active matrix type light emitting device manufactured according to the present invention) 3064, voice output portions 3062 and 3063, operation switches 3065, an antenna 3066, and the like. By applying the present invention to such as these mobile devices, electric power consumption concerning display can be reduced. Thereby, available time can be extended.

Figure 14C:
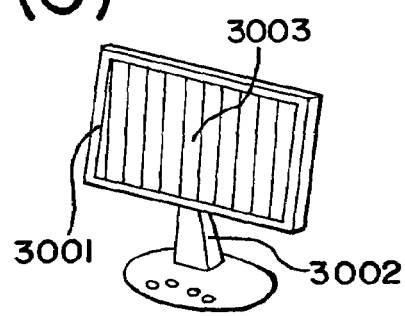

FIG. 14(C) is a monitor manufactured according to the present invention provided with a display portion (an active matrix type light emitting device manufactured according to the present invention) 3003. A body 3031 is provided with system on panel (a display portion) 3003, a chassis 3001, supporter 3002, and the like. In this way, according to the present invention, lighting efficiency is improved and thereby a clearer image can be obtained.

According to the present invention, a light emitting device of a top light emitting type which has a reflection film and higher lighting efficiency can be obtained. In a light emitting device of the present invention, manufacturing cost can be reduced compared to a conventional light emitting device of a top light emitting type since an interlayer insulating film, an electrode of a light emitting element, a source electrode, and a wiring can be formed at the same time. Moreover, concerning concavity and convexity formed by an interlayer insulating film being etched, or a hillock generated by aluminum, a structure which can suppress defect caused due to these concavity and convexity is adopted to improve yield. Therefore, an electronics device to which the present invention is applied, low electric power consumption, improvement of image quality, and cost reduction can be achieved.

The invention claimed is:
1. A light emitting device comprising:
a first conductive film; and
an electrode comprising a second conductive film and a third conductive film provided so as to laminate with the first conductive film, wherein a lamination part of the first conductive film and the second conductive film in the electrode functions as a source electrode; and wherein a lamination part of the first conductive film and the third conductive film in the electrode functions as an electrode of a light emitting element.

2. A light emitting device comprising:
a first conductive film; and
an electrode comprising a second conductive film and a third conductive film provided so as to laminate with the first conductive film,
wherein a lamination part of the first conductive film and the second conductive film in the electrode is adjacent to a source of a thin film transistor; and
wherein a lamination part of the first conductive film and the third conductive film in the electrode is adjacent to a light emitting layer.

3. A light emitting device according to claim 1 or claim 2, wherein the second conductive film is a film containing aluminum.

4. A light emitting device comprising:
a first conductive film; and
an electrode comprising:
   a second conductive film provided so as to laminate the first conductive film;
   a third conductive film provided so as to overlap with the first conductive film; and
   a fourth conductive film sandwiched between the first conductive film and the third conductive film;
wherein a lamination part of first conductive film and the second conductive film in the electrode functions as a source electrode, and
wherein a lamination part of the first conductive film, the fourth conductive film, and the third conductive film in the electrode functions as an electrode of a light emitting element.

5. A light emitting device comprising:
a first conductive film; and
an electrode comprising:
   a second conductive film provided so as to laminate with the first conductive film;
   a third conductive film provided so as to overlap with the first conductive film; and
   a fourth conductive film sandwiched between the first conductive film and the third conductive film,;
wherein a lamination part of the first conductive film and the second conductive film in the electrode is adjacent to a source electrode of a thin film transistor; and
wherein a lamination part of the first conductive film, the fourth conductive film, and the third conductive film in the electrode is adjacent to a light emitting layer.

6. A light emitting device according to claim 4 or claim 5, wherein both of the second conductive film and the fourth conductive film are films containing aluminum.

7. A light emitting device comprising:
a first conductive film;
a second conductive film provided so as to laminate with the first conductive film;
a third conductive film; and
a fourth conductive film provided so as to laminate with the third conductive film,
wherein one of the third conductive film or the fourth conductive film is adjacent to the second conductive film;
wherein a lamination part of the first conductive film and the second conductive film functions as a source electrode; and
wherein a lamination part of the third conductive film and the fourth conductive film functions as an electrode of a light emitting element.

8. A light emitting device comprising:
a first conductive film;
a second conductive film provided so as to laminate with the first conductive film;
a third conductive film; and
a fourth conductive film provided so as to laminate with the third conductive film,
wherein one of the third conductive film or the fourth conductive film is adjacent to the second conductive film;
wherein a lamination part of the first conductive film and the second conductive film is adjacent to a source electrode of a thin film transistor; and
wherein a lamination part of the third conductive film and the fourth conductive film is adjacent to a light emitting layer.

9. A light emitting device according to claim 7 or claim 8, wherein the second conductive film is a film containing aluminum.

10. An electronics device having the light emitting device according to claim 1 or claim 2, wherein the light emmiting device is mounted in a display portion.

11. An electronics device according to claim 10, wherein the electronics device is selected from the group consisting of a display, a cellular phone, a Personal Ditgital Assistant, a television, and a monitor.

12. An electronics device having the light emitting device according to claim 4 or claim 5, wherein the light emitting device is mounted in a display portion.

13. An electronics device according to claim 12, wherein the electronics device is selected from the group consisting of a display, a cellular phone, a Personal Digital Assistant, a television, and a monitor.

14. An electronics device having the light emitting device according to claim 7 or claim 8, wherein the light emmitting device is mounted in a display portion.

15. An electronics device according to claim 14, wherein the electronics device is selected from the group consisting of a display, a celluar phone, a Personal Digital Assistant, a televison, and a monitor.

* * * * *